United States Patent [19]

Sakai et al.

[11] Patent Number: 5,322,574

[45] Date of Patent: Jun. 21, 1994

[54] METHOD OF MANUFACTURING A HIGH STRENGTH, HIGH CONDUCTIVITY COPPER-SILVER ALLOY

[75] Inventors: Yoshikazu Sakai; Kiyoshi Inoue; Hiroshi Maeda, all of Ibaraki, Japan

[73] Assignee: National Research Institute For Metals, Tokyo, Japan

[21] Appl. No.: 743,223

[22] Filed: Aug. 9, 1991

[30] Foreign Application Priority Data

Aug. 9, 1990 [JP] Japan ..................................... 209239

[51] Int. Cl.$^5$ ............................ C22F 1/02; C22F 1/08
[52] U.S. Cl. .................................. 148/538; 148/680; 148/684
[58] Field of Search ..................... 148/538, 680, 684

[56] References Cited

PUBLICATIONS

Duwez, P., R. H. Willens and W. Klement, Jr. J. Applied Phys., 31 (1960) 1136.
Goto, T. Trans. Jpn. Inst. Met. (Jul. 1979) 20, (7), 377–382.
Metal Alloys Index 80(12): 31–4234 1980.
Metals Handbook, 9th Ed., vol. 2, pp. 266–267, 269–272 1979.

*Primary Examiner*—R. Dean
*Assistant Examiner*—Margery S. Phipps
*Attorney, Agent, or Firm*—Wenderoth, Lind & Ponack

[57] ABSTRACT

The present invention provides a new copper alloy containing silver from 4 to 32 at. %, which is useful for a magnet conductor, an IC lead frame, etc., having simultaneously a high strength and a high conductivity, manufactured by blending from 4 to 32 at. % silver into copper, casting, rapidly cooling and cold-working wherein the cold-working step includes a hot working treatment at a reduction rate of 40% to 70% at temperatures of from 300° to 500° C.

3 Claims, 3 Drawing Sheets

METHOD OF MANUFACTURING A HIGH STRENGTH, HIGH CONDUCTIVITY COPPER-SILVER ALLOY

FIELD OF THE INVENTION

The present invention relates to a high-strength and high-conductivity copper alloy and a method of manufacturing the same. More particularly, the present invention relates to a new copper alloy useful for a conductor of high field magnet an IC lead frame, etc. which has both high-strength and high-conductivity, and a method of manufacturing the same.

DESCRIPTION OF THE PRIOR ART

There has been a strong demand for the development of an alloy material having a high strength and being simultaneously highly conductive. For an alloy used as a conductive material, in general, conductivity and strength show inverse tendencies, and increasing strength inevitably leads to a lower conductivity. Even in the case of an ordinary copper-silver alloy, therefore, it was imperative to minimize the amount of added silver to a level of 0.5 to 1% so as to achieve a desired conductivity. It was therefore impossible to improve strength through working.

A conceivable solution to this inconvenience is to dissolve silver into initial phase copper or dissolve copper and silver into the eutectic phase, but the resultant product is often used without applying a heat treatment aiming precipitation. A high strength and a high conductivity therefore still remain difficult to be compatible with each other.

However, a conductive material for a long-pulse magnet or a water-cooled copper magnet producing a high magnetic field, or a reinforcing/stabilizing material for a superconductive wire is required to have a strength sufficient to withstand a strong electromagnetic force produced from the high magnetic field, and at the same time, a high conductivity giving only a slight heat even with a large current, and this need is far increasing.

In the electronic industry, development of a conductive material having the highest conductivity and the highest strength is demanded to cope with rapid innovations in electronics for the lead frame for an IC circuit, for example. However, a material capable of simultaneously satisfying these properties has not as yet been proposed.

The present invention has an object to provide a new alloy material having a high strength and simultaneously a high conductivity, and a method of manufacturing the same.

More particularly, the present invention has an object to provide quite a new high-strength and high-conductivity copper-silver alloy conventionally unavailable and a method of manufacturing the same.

Other and further objects, features and advantages of the present invention will appear more fully from the following description.

DETAILED DESCRIPTION OF THE INVENTION

Figure 1:
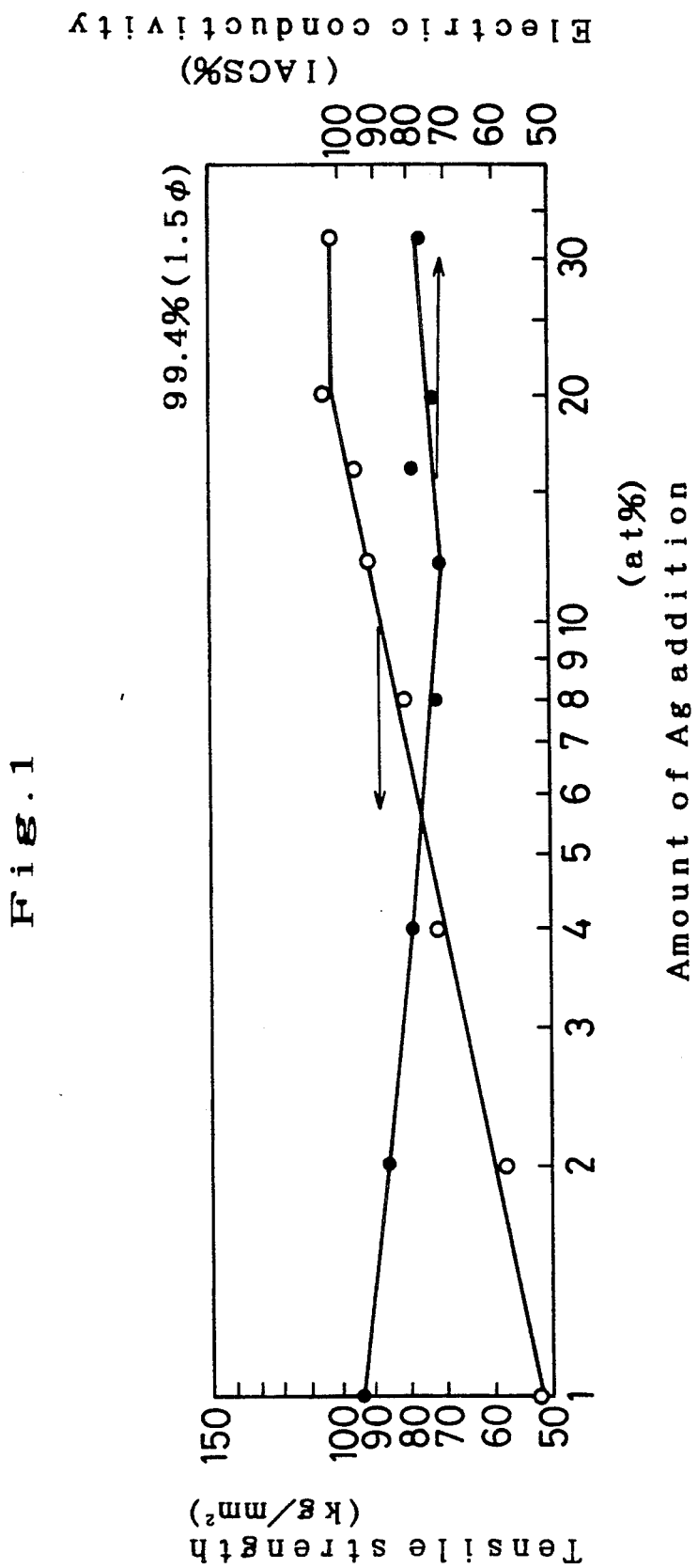
FIG. 1 is a graph illustrating tensile strength and electric conductivity vs. the amount of silver addition in the alloy of the present invention.

The present invention provides a high-strength and high-conductivity copper alloy containing from 4 to 32 at. % silver.

The present invention also provides a method of manufacturing the above-mentioned alloy, which comprises the steps of blending from 4 to 32 at. % silver into copper, casting, rapidly cooling, and then applying cold working.

More specifically, the present invention was completed on the basis of the following new findings; and initial phase copper and an eutectic phase of copper and silver are uniformly and finely crystallized through addition of from 4 to 32 at. % silver into copper, and by the steps of casting, rapidly cooling and then cold-working, the initial phase copper and the eutectic phase are stretched into a filament shape and strength of the copper-silver alloy is remarkable improved.

In addition, the present invention permits improvement of both strength and conductivity by causing precipitation of silver and copper dissolved in the initial phase and the eutectic phase through application of a multiple-stage heat treatment in the middle of working.

In the copper alloy of the present invention, the amount of added silver is limited within a certain range. With an amount of added silver of under 4 at. % relative to copper, crystallization of the eutectic phase becomes non-uniform. With an amount of added silver of over 32 at. %, on the other hand, working is difficult and economic disadvantages result.

The amount of added silver should therefore be limited within a range of from 4 to 32 at. %. Presence of other elements within the amount of impurity poses no problem.

For this copper-silver alloy, application of a homogenization treatment or a solid-solution treatment makes it very difficult to conduct working because of the grain growth, producing cracks during working. Application of a heat treatment before working brings about no effect. On the other hand, application of a heat treatment, particularly a multiple-stage heat treatment permits improvement of strength and conductivity.

In the manufacturing method of the present invention, therefore, a preferred embodiment comprises the steps of, in the middle of cold working, applying a multiple-stage heat treatment under condition of a temperature of from 300° to 550° C. and a heat treatment time of from 0.5 to 40 hours in a vacuum atmosphere or an inert gas atmosphere.

The alloy of the present invention is applicable as a conductive material required to have a high strength and a high conductivity such as a long-pulse magnet or a water-cooled copper magnet intended to produce a high magnetic field, and furthermore, can produce a high magnetic field with a smaller amount of electricity. In the case where the alloy of the present invention is used as a reinforcing/stabilizing material of a super-conductive wire, it provides a favorable merit in that only a smaller quantity of reinforcing material suffices because of the higher strength. Also in the area of electronic industry, the alloy of the present invention is applicable as a material for a lead frame of an IC circuit because of the above-mentioned features.

Since properties over wide ranges are available through combinations of working and heat treatments, it is possible to select a strength and a conductivity befitting a particular use. Both melting and working are easy and facilitate to be scaled up. This is advantageous in that conventional manufacturing facilities and conventional manufacturing technologies are applicable.

Now, the present invention is described further in detail by means of an example.

EXAMPLE

Silver was added in various amounts within a range of from 1 to 32 at. % to copper, and each of the resultant alloys was melted under vacuum or in an inert gas atmosphere, cast and then rapidly cooled. After grinding the surface, wire drawing was applied by means of cold grooved rolls and swaging. In the middle of working, a hot working treatment was effected at a reduction rate of 40% and 70% at a temperature within a range of from 400° to 500° C. for a period of time within a range of from 1 to 5 hours.

After the heat treatment, wire drawing was continued, and a tensile test was carried out on the resultant wire having a prescribed diameter at the room temperature, and conductivity was measured.

Each of changes in strength and conductivity relative to the amount of added silver when working the sample up to a reduction rate of 99.4% is shown in FIG. 1.

As the amount of added silver increases, tensile strength becomes higher, whereas conductivity becomes lower in contrast, with a slight rate.

Figure 2:
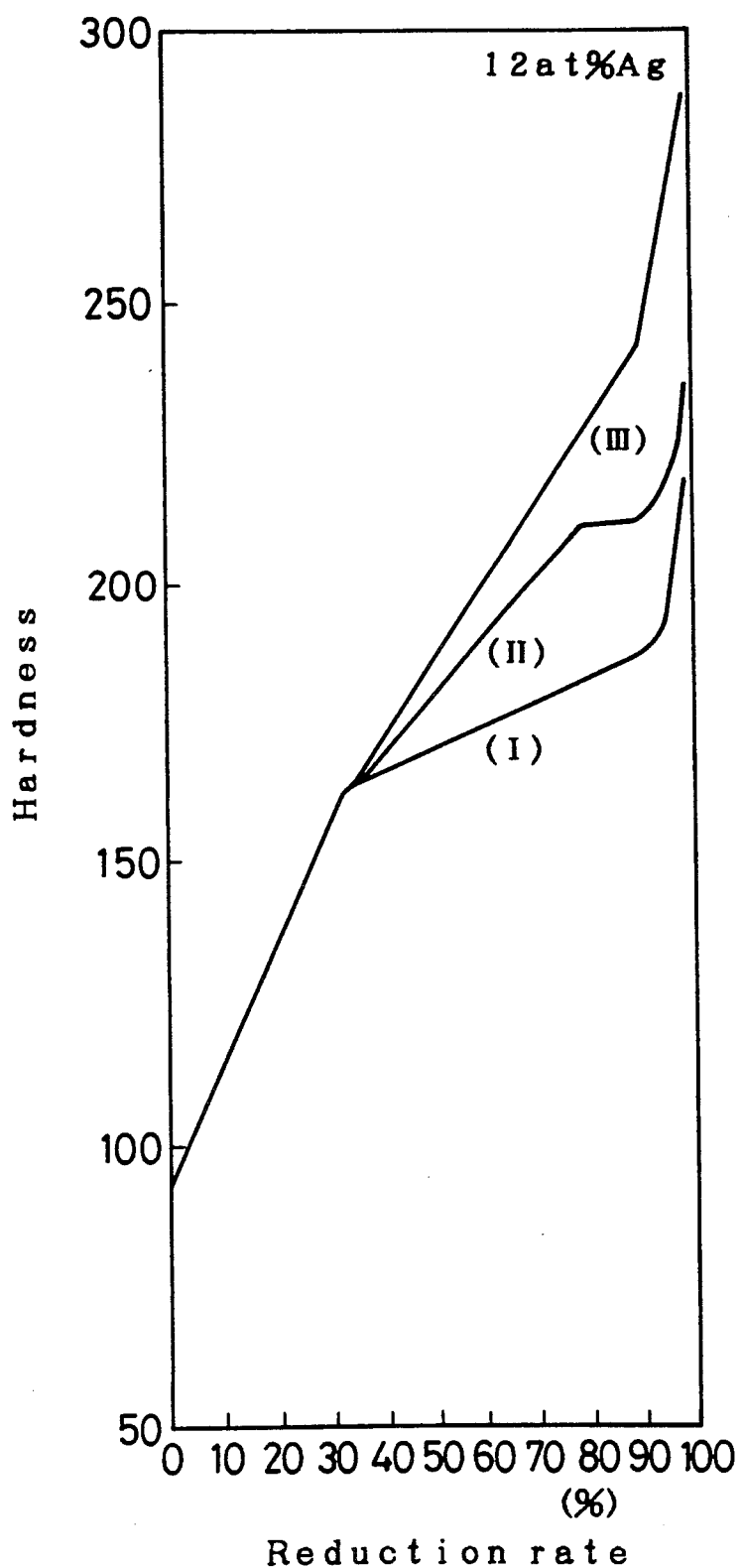
FIG. 2 is a graph illustrating hardness vs. reduction rate.

FIG. 2 illustrates changes in hardness relative to the reduction rate of a copper alloy containing 12 at. % silver. In FIG. 2, the curve [I] represents a non-heat-treated material and a material subjected to a heat treatment at 450° C. for one hour before working, the curve [II] represents a material heat-treated at 450° C. for one hour at a reduction rate of 40% in the middle of working; and the curve [III] represents a material heat-treated at 450° C. for one hour at a reduction rate of 40 and 70%. The results reveal that the material which was hot worked has a higher hardness than that not heat-treated and that heat-treated before working.

Figure 3:
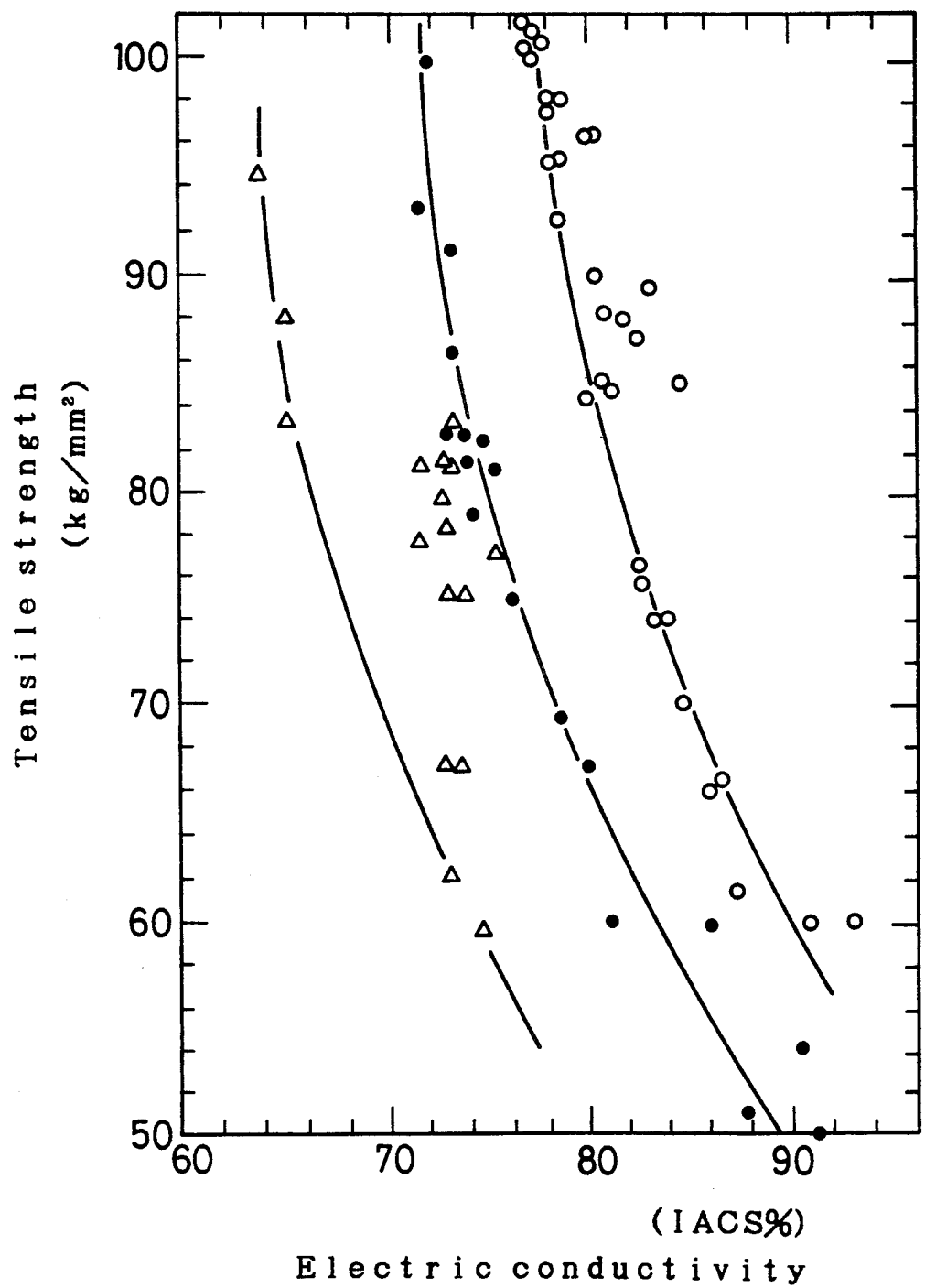
FIG. 3 is a graph illustrating the effect of heat treatment on strength and conductivity of the alloy with various values of silver concentrations and reduction rates.

FIG. 3 illustrates the effect of heat treatment on strength and conductivity of alloys with various silver concentrations and reduction rates. In FIG. 3, the mark "Δ" represents a non-heat-treated material and a material heat-treated before working; the mark "●" represents a material hot-worked at a reduction rate of 40%; and the mark "o" represents materials hot worked at a reduction rate of 40% and 70%. The results show that the method of the present invention comprising hot working a material in the remarkably improves strength and conductivity of the alloy. It is also known from these results that properties over wide ranges are available through combinations of the silver concentration of the alloy and working/heat treatment.

Table 1 shows observed values regarding the effect of heat treatment on strength and conductivity of a copper alloy containing 16 at. % silver. This demonstrates that strength and conductivity largely vary with heat-treatment conditions.

As is clear from these results as described above, the availability of a high-strength and high-conductivity cooper alloy by the method of the present invention is confirmed. It is confirmed from the observation of the structure of the alloy that cold wire drawing stretches the initial phase and the eutectic phase into a filament shape.

It is needless to mention that the present invention is not limited to the above-mentioned example, since various embodiments are possible.

TABLE 1

| Heat treatment condition | Proof stress δ. 0.2 kg/mm$^2$ | Tensile strength δ UTS kg/mm$^2$ | Conductivity IACS % |
|---|---|---|---|
| Non-heat-treated | 71.6 | 74.7 | 72.6 |
| 500° C., 1 hr./ 400° C., 1 hr. | 80.6 | 85.1 | 84.8 |
| 400° C., 1 hr./ 420° C., 1 hr. | 87.1 | 90 | 80.3 |
| 450° C., 2 hr./ 400° C., 1 hr. | 93.8 | 99 | 78.4 |

We claim:

1. A method of manufacturing a high-strength and high-conductivity copper alloy, which comprises the sequence of steps of blending from 4 to 32 at. % silver into copper to produce a blend, then casting and rapidly cooling the thus-produced blend, followed by cold-working it, said cold-working step including at least a one-stage hot working treatment at a reduction rate of 40% to 70% at temperatures of from 300° to 550° C. and for 0.5 to 40 hours in a vacuum or an inert gas atmosphere.

2. A method as claimed in claim 1, wherein said hot working treatment is a multiple stage not working treatment.

3. A method as claimed in claim 1, wherein said hot working treatment is carried out within a temperature range of 400° C. to 500° C. for a time of 1 to 5 hours at a reduction rate of 40% to 70%.

* * * * *